US012586709B2

(12) United States Patent
Sizov et al.

(10) Patent No.: US 12,586,709 B2
(45) Date of Patent: Mar. 24, 2026

(54) SYSTEM AND METHOD FOR REDUCING POWER LOSSES FOR MAGNETICS INTEGRATED IN A PRINTED CIRCUIT BOARD

(71) Applicant: Rockwell Automation Technologies, Inc., Mayfield Heights, OH (US)

(72) Inventors: Gennadi Sizov, Shorewood, WI (US); Zoran Vrankovic, Greenfield, WI (US); Gary L. Skibinski, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 117 days.

(21) Appl. No.: 18/216,277

(22) Filed: Jun. 29, 2023

(65) Prior Publication Data

US 2023/0343506 A1 Oct. 26, 2023

Related U.S. Application Data

(62) Division of application No. 16/398,486, filed on Apr. 30, 2019, now abandoned.

(51) Int. Cl.
H01F 27/28 (2006.01)
H01F 5/00 (2006.01)
(Continued)

(52) U.S. Cl.
CPC ......... H01F 27/2804 (2013.01); H01F 5/003 (2013.01); H01F 17/0006 (2013.01);
(Continued)

(58) Field of Classification Search
CPC ............. H01F 17/0013; H01F 27/2804; H01F 2027/2809; H01F 17/0006; H01F 5/003;
(Continued)

(56) References Cited

U.S. PATENT DOCUMENTS 7,701,317 B2 4/2010 Sullivan et al.
8,331,103 B2 * 12/2012 Oka ........................ H05K 1/165
336/200
(Continued)

FOREIGN PATENT DOCUMENTS

CN 105590735 A * 5/2016
WO WO-2006033071 A1 * 3/2006 ............. H01F 27/10

OTHER PUBLICATIONS

Jiankun Hu and C. R. Sullivan, "The quasi-distributed gap technique for planar inductors: design guidelines," IAS 97. Conference Record of the 1997 IEEE Industry Applications Conference Thirty-Second IAS Annual Meeting, New Orleans, LA, USA, 1997, pp. 1147-1152 vol. 2—(8) pages.

(Continued)

*Primary Examiner* — Tszfung J Chan
(74) *Attorney, Agent, or Firm* — Boyle Fredrickson, S.C.

(57) ABSTRACT

A system and method for integrating a magnetic component within a power converter includes a coil integrated on a PCB. The PCB includes multiple layers and traces on each layer to form a single coil or to form multiple coils on the magnetic component. The PCB further includes at least one opening in the PCB through which a core component may pass, such that the magnetic component is defined by the coils and the core material. To reduce eddy currents built up within the traces, the dimensions of traces on a layer are varied and the position of traces between layers of the PCB are varied. The widths and locations of individual traces are selected to reduce coupling of the trace to leakage fluxes within the magnetic component. A floating conductive layer may also be provided to still further reduce the magnitude of eddy currents induced within the coil.

20 Claims, 10 Drawing Sheets

(51) Int. Cl.

| | |
|---|---|
| *H01F 17/00* | (2006.01) |
| *H01F 27/34* | (2006.01) |
| *H02M 1/12* | (2006.01) |
| *H05K 1/181* | (2026.01) |

(52) U.S. Cl.
CPC ....... *H01F 27/2885* (2013.01); *H01F 27/346* (2013.01); *H02M 1/12* (2013.01); *H05K 1/181* (2013.01); *H01F 2027/2809* (2013.01); *H05K 2201/0792* (2013.01); *H05K 2201/08* (2013.01)

(58) Field of Classification Search
CPC .. H01F 27/2885; H01F 27/288; H01F 27/346; H01F 2027/348; H01F 27/36
USPC .................................................. 336/200, 232
See application file for complete search history.

(56) References Cited

U.S. PATENT DOCUMENTS

| | | | | |
|---|---|---|---|---|
| 9,666,354 | B2 * | 5/2017 | Zuo ..................... | H01F 27/2804 |
| 2011/0260823 | A1 | 10/2011 | Mui | |
| 2013/0200982 | A1 * | 8/2013 | Adachi ................. | H01F 27/289 |
| | | | | 336/84 R |
| 2013/0207767 | A1 * | 8/2013 | Worthington ......... | H01F 27/363 |
| | | | | 336/84 C |
| 2014/0110821 | A1 * | 4/2014 | Barry .................. | H01L 23/5227 |
| | | | | 257/E29.325 |

| | | | | |
|---|---|---|---|---|
| 2014/0320048 | A1 | 10/2014 | Vrankovic et al. | |
| 2017/0200552 | A1 | 7/2017 | Chung et al. | |
| 2018/0166203 | A1 | 6/2018 | Chin | |
| 2018/0317313 | A1 * | 11/2018 | Kegeler ................. | H05K 1/165 |

OTHER PUBLICATIONS

J. Hu and C. R. Sullivan, "Analytical method for generalization of numerically optimized inductor winding shapes," 30th Annual IEEE Power Electronics Specialists Conference. Record. (Cat. No. 99CH36321), Charleston, SC, USA, 1999, pp. 568-573 vol. 1—(6) pages.

Shen Wang, M.A. De Rooij, W. G. Odendall, J.D. Van Wyk and D. Boroyevich, "Reduction of high-frequency conduction losses using a planar litz structure," in IEEE Transactions on Power Electronics, vol. 20, No. 2, pp. 261-267, Mar. 2005—(7) pages.

I. Lope, J. Acero, J. Serrano, C. Carretero, R. Alonso and J. M. Burdio, "Minimization of vias in PCB Implementations of planar coils with litz-wire structure," 2015 IEEE Applied Power Electronics Conference and Exposition (APEC), Charlotte, NC, 2015, pp. 2512-2517—(6) pages.

Jiankun Hu and C. R. Sullivan, "Optimization of shapes for round-wire high-frequency gapped-inductor windings," Conference Record of 1998 IEEE Industry Applications Conference. Thirty-Third IAS Annual Meeting (Cat. No. 98CH36242), St. Louis, MO, USA, 1998, pp. 907-991.2 vol. 2—(6) pages.

* cited by examiner

SYSTEM AND METHOD FOR REDUCING POWER LOSSES FOR MAGNETICS INTEGRATED IN A PRINTED CIRCUIT BOARD

CROSS-REFERENCE TO RELATED APPLICATIONS

This application is a divisional of and claims priority to U.S. application Ser. No. 16/398,486, filed Apr. 30, 2019, the entire contents of which is incorporated herein by reference.

BACKGROUND INFORMATION

The subject matter disclosed herein relates generally to reducing power losses in magnetic devices for use in power conversion devices and, more specifically, to a system for reducing power losses in a magnetic device integrated in a printed circuit board (PCB) for use in the power conversion device.

As is known to those skilled in the art, power conversion devices receive power in a first form at an input to the device and provide power in a second form at an output from the device. The power may be received or delivered as either alternating current (AC) or direct current (DC) at varying amplitudes of voltage and/or current. Common power conversion devices include an AC-to-DC converter, a DC-to-AC converter, a boost converter, a buck converter, a multi-level converter, a voltage regulator, and the like. When the power conversion device uses a switching element to perform the power conversion, it may also be referred to as a switched-mode power converter (SMPC) or a switched-mode power supply (SMPS). The switching element in a SMPC is typically a solid-state device having a sufficient power rating to handle the power conversion, such as an insulated-gate bipolar transistor (IGBT), metal-oxide semiconductor field-effect transistor (MOSFET), or other power electronic switching device. The switching element is controlled to alternately turn off and on, thereby alternately opening or closing a conduction path that is used either singly or in combination with other power electronic switching devices to convert the power from the first form at the input to the second form at the output.

As is also known, the power conversion device may utilize a modulation routine, such as pulse width modulation, to control turning the power electronic switching devices on and off. The modulation may occur at frequencies ranging from the hundreds of hertz to tens of kilohertz. The frequency at which modulation occurs is commonly referred to as the switching frequency, and the length of time for one switching cycle is commonly referred to as the switching period. Each electronic switching device is either turned on or off for a percentage of the switching period. The length of time within a switching period and the number of cycles for which a particular electronic switching device is turned on will help define the amplitude of the voltage output from the power conversion device. Additional components, such as inductors and/or capacitors within the power conversion device may be used to increase or decrease the amplitude of voltage and/or current or to smooth the waveform of the output voltage or current from the power conversion device.

While the modulation routine controls the switching devices to convert the power from the first form to the second form, it also generates electrical signals at undesired frequencies. If, for example, the output power is an AC voltage, the modulation routine will generate an output voltage with a fundamental frequency at the desired frequency of the AC output voltage. The modulation routine, however, also generates high frequency signals at the switching frequency and multiples, or harmonics, thereof. The high frequency signals may result in undesired radiated and/or conducted emissions at the output of the power converter.

Historically, it has been known to provide a choke at the output of the power converter to reduce the undesired high frequency content from the power converter. The choke is a high frequency filter that allows DC or low frequency AC components to pass while attenuating or eliminating high frequency AC components. The choke may be configured to filter the harmonic content generated by modulation of the switching device and to allow the desired fundamental AC component to pass. The choke is typically constructed of a core material and one or more windings of conductors wrapped around the core material. The choke acts, in large part, as an inductor, representing high impedance to high-frequency AC components. The energy in these high-frequency components is, therefore, dissipated in the choke in the form of heat. As the power rating of the power conversion device increases, the current rating of the conductors and, therefore, the size of the wires increases. Similarly, the size of the core around which the wires are to be wrapped increases. The amount of heat lost in the choke as a result of filtering the high frequency content also increases. While an increase in the size of the core may provide some capacity for increased heat dissipation by the core, the additional energy dissipated in the core from increased high frequency content may demand further cooling of the choke, such as a heat sink, air cooling, or liquid cooling. The size and heat dissipation requirements of the choke typically result in a bulky filter component requiring substantial space in a control cabinet and may also require a fan or fluid pumps and hydraulic components to implement air or liquid cooling.

More recently, efforts have been made to incorporate a magnetic component within the power converter. However, such efforts are subject to the same drawbacks as external chokes. Introduction of the magnetic component within the power converter moves the power losses and heat generation caused by the magnetic component within the power conversion device. The heat generation limits the application of magnetic components within the power converter to low power devices. Alternately, the heat generation may require addition of heat sinks, forced air cooling, or liquid cooling increasing the size and cost of the power converter.

Thus, it would be desirable to provide a system and method for integrating a magnetic component within a power converter that minimizes the power losses within the magnetic component. It is a further aspect of the invention, that the magnetic component is scalable to power converters of greater power ratings as a result of the reduced power losses within the magnetic component.

BRIEF DESCRIPTION

The subject matter disclosed herein describes a system and method for integrating a magnetic component within a power converter that minimizes the power losses within the magnetic component. The magnetic component includes a coil integrated on a printed circuit board (PCB) within the power converter. The PCB includes multiple layers and traces on each layer are joined together to form a single coil or to form multiple coils on the magnetic component. The PCB further includes at least one opening in the PCB through which a core component may pass. The traces forming the coils may be laid out to encircle the opening and the core material, such that the magnetic component is defined by the coils and the core material. According to a first aspect of the invention, the dimensions of traces on a layer are varied within the coil to reduce eddy currents within the traces resulting from air-gap fringing flux. The air-gap fringing flux is greatest proximate the opening in the PCB and at the air-gap in the core component. By making the width of individual traces that are closest to the opening within the coil narrower than traces that are further from the opening, the conductive material of the coil located within the region of high air-gap fringing flux is reduced. As a result, the eddy currents induced within the coil due to the air-gap fringing flux is reduced. According to another aspect of the invention, the position of traces between layers of the PCB are varied. The locations of individual traces are selected such that a higher percentage of traces are located in a region having a lower magnetic field component and, therefore, reducing coupling to leakage fluxes within the magnetic component. According to still another aspect of the invention, a floating conductive layer is positioned between the coil and the core material. The floating conductive layer may be a conductive sheet or series of traces located on one layer of the PCB where the conductive layer is not connected to the coil. The conductive layer is preferably located near a surface of the PCB such that eddy currents and the resulting heat induced within the conductive layer are more readily dissipated out of the PCB. As a result of the various features to reduce the power losses and increase the efficiency within the magnetic component, the magnetic component is scalable to power converters having greater power ratings than a magnetic component of traditional construction.

According to one embodiment of the invention, a magnetic component includes a circuit board and a coil defined by multiple traces located on the circuit board. The circuit board has multiple layers and an opening extending through the circuit board. The traces include at least one trace on each of the of layers of the circuit board, where at least one trace on each layer extends around the opening through the circuit board to define multiple loops on the respective layer. The loops on one layer define an inner trace proximate the opening through the circuit board, an outer trace distal from the opening through the circuit board, and at least one intermediate trace located between the inner trace and the outer trace. A first width of the inner trace is less than a second width of the at least one intermediate trace, and a second width of the at least one intermediate trace is less than a third width of the outer trace.

According to another embodiment of the invention, a magnetic component includes a circuit board, having multiple layers and an opening extending through the circuit board, and a coil defined by multiple traces. The traces include at least one trace on each layer of the circuit board, and the trace on each layer extends around the opening through the circuit board to define multiple loops on the respective layer. The plurality of loops on one layer define an inner trace proximate the opening through the circuit board, an outer trace distal from the opening through the circuit board, and at least one intermediate trace located between the inner trace and the outer trace. The inner trace on each layer has a first axis, the at least one intermediate trace on each layer has a second axis, and the outer trace on each layer has a third axis. At least one of the first axis, second axis, and third axis on one layer is offset from the corresponding axis on another layer.

According to still another embodiment of the invention, a method of integrating a magnetic component in a circuit board is disclosed. Multiple traces are defined for a circuit board, where the circuit board includes multiple layers and an opening extending therethrough. The traces include at least one trace on each of the layers of the circuit board, and the trace on each layer extends around the opening through the circuit board to define multiple loops on the respective layer. The loops on one layer define an inner trace proximate the opening extending the circuit board, an outer trace distal from the opening through the circuit board, and at least one intermediate trace located between the inner trace and the outer trace. A first width of the inner trace is less than a second width of the at least one intermediate trace, and a second width of the at least one intermediate trace is less than a third width of the outer trace. A core is mounted to the circuit board, where a portion of the core is inserted through the opening and the core extends laterally over at least a portion of the plurality of traces.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
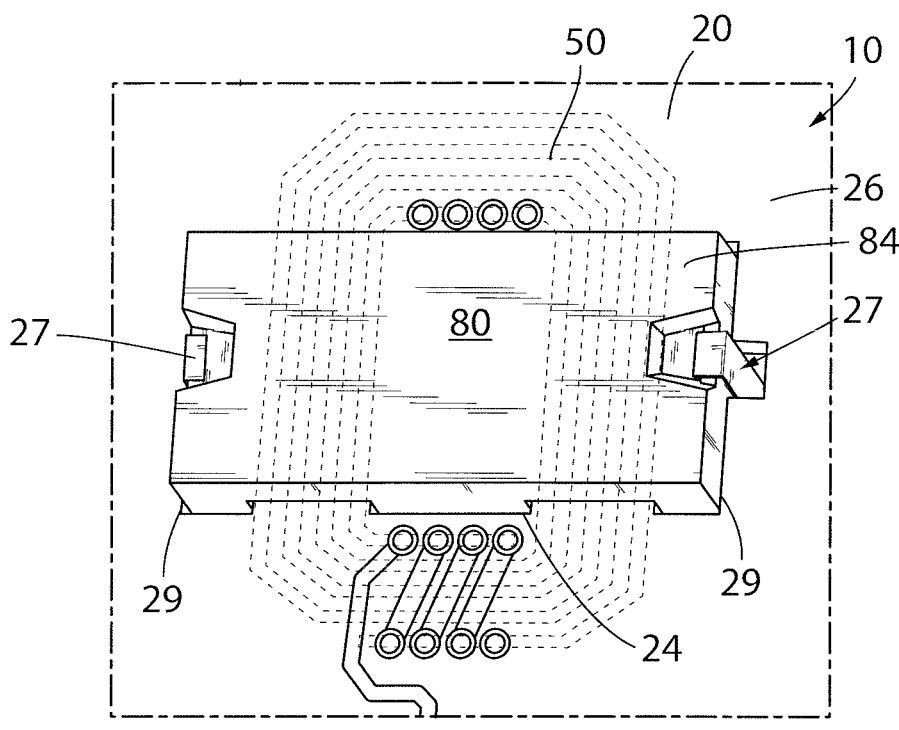
FIG. 1 is a top view of a magnetic component integrated into a PCB according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

As previously discussed, the subject matter disclosed herein describes a system and method for integrating a magnetic component within a power converter that minimizes the power losses within the magnetic component. One such power conversion device is a motor drive. Although the magnetic component disclosed herein may be used in a number of different power converters or SMPSs, application within a motor drive will be considered for purposed of explanation. Motor drives are utilized to control operation of a motor by regulating the magnitude and frequency of the output voltage provided to the motor to achieve, for example, a desired operating speed of the motor or a desired torque produced within the motor. According to one common configuration, a motor drive includes a DC bus having a DC voltage of suitable magnitude from which an AC voltage may be generated and provided to the motor. The DC voltage may be provided as an input to the motor drive or, alternately, the motor drive may include a rectifier section which converts an AC voltage input to the DC voltage present on the DC bus. The motor drive includes power electronic switching devices, such as insulated gate bipolar transistors (IGBTs), field-effect transistors (FETs), metal-oxide semiconductor FETs (MOSFETs), thyristors, or silicon-controlled rectifiers (SCRs). The motor drive further includes a reverse conduction power electronic device, such as a free-wheeling diode, connected in parallel across the power electronic switching device. The reverse conduction power electronic device is configured to conduct during time intervals in which the power electronic switching device is not conducting. A controller, such as a microprocessor or dedicated motor controller, generates switching signals to selectively turn on or off each power electronic switching device to generate a desired DC voltage on the DC bus or a desired motor voltage.

The controller for the motor drive typically utilizes a modulation routine, such as pulse width modulation, to generate the switching signals to control the power electronic switching devices that alternately connect and disconnect the DC bus to one phase of the output to the motor. The modulation routine determines a percentage, or duty cycle, of the duration of one modulation period for which the DC bus is connected to the output. Ideally, when the output is connected to the DC bus, the voltage level on the DC bus is present at the output, and when the output is disconnected from the DC bus, there is zero volts present at the output. Multiplying the voltage level on the DC bus by the duty cycle yields an average value of voltage present at the output during each modulation period. By controlling the duty cycle, the modulation routine controls the average value of voltage present at the output. In addition, if the modulation period is small (i.e., the switching frequency is high) the average value may be controlled to approximate an AC output voltage.

Although the modulation routine converts a DC voltage into an AC voltage, it also generates electrical signals at frequencies other than the desired fundamental frequency of the AC output voltage. The modulation routine generates high frequency square waves having variable duty cycles. While the square wave includes a fundamental component having an amplitude and frequency corresponding to the desired operation of the motor, the square wave also includes harmonic content at various frequencies that are multiples of the switching frequency. Further, the amplitude of the voltage and current conducted through the switching devices may be sizable in comparison, for example, to control signals within the drive or other electronic devices. The motor may require fundamental output voltages having magnitudes, for example, of 230 or 460 V at currents having magnitudes in the amps to hundreds of amps. Although, the magnitude of the harmonic content is a percentage of the fundamental output to the motor, the magnitude of the high frequency signals may still be significant and generate undesirable radiated emissions from the motor drive.

In one embodiment of the motor drive, switching devices suitable for more rapid switching may be selected. The switching device may be, for example, field-effect transistors (FETs) made of silicon carbide (SiC MOSFETs) or gallium nitride (GaN FETs) where the switching frequencies may increase to tens or hundreds of kilohertz (e.g., 30 kHz-500 kHz) in contrast to traditional FETs which are typically limited to upper switching frequencies in the range of 10 kHz-20 kHz. The greater the frequency at which the power switching devices are able to be modulated, the lower the amplitude of the harmonic content present on the output of the motor drive. Thus, including switching devices suitable for switching in the tens to lower hundreds of kilohertz range reduces the magnitude of the harmonic content that requires filtering and similarly reduces the physical size of the magnetic component.

It is desirable to eliminate the harmonic content and to deliver a sinusoidal output from the motor drive rather than a modulated square wave to control operation of the motor. Integration of a magnetic device as a filter at the output of the motor drive may attenuate or eliminate the harmonic content of the output voltage while allowing the desired fundamental component to be provided to the motor. It is further contemplated that three separate magnetic components may be incorporated into the motor drive, where each magnetic component is connected in series with one phase of a three-phase output to a motor to deliver a three-phase sinusoidal output voltage to the motor.

Figure 2:
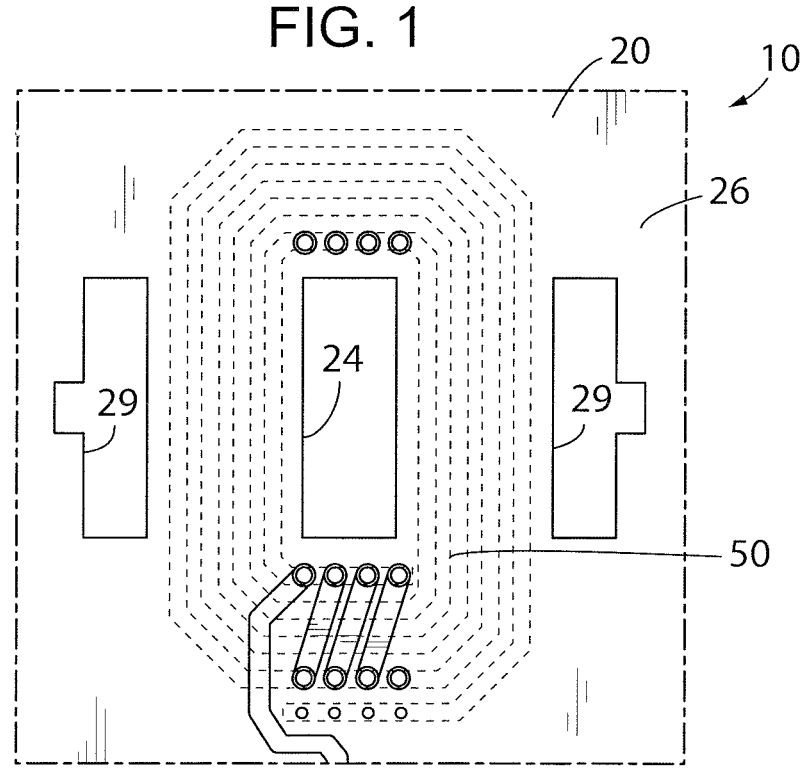
FIG. 2 is a top plan view of the PCB for the magnetic component of FIG. 1.

Turning initially to FIG. 1, a first embodiment of a magnetic component 10 integrated into a circuit board 20 is illustrated. The PCB 20 is a multi-layer board where a coil 50 is defined by multiple loops of circuit traces on the PCB. With reference also to FIG. 2, a first opening 24 extends through the PCB 20 which is configured to receive a center portion of a core 80. A pair of side openings 29 also extend through the PCB 20 with a first side opening 29 positioned to one side of the first opening 24 and a second side opening 29 positioned on the opposite side of the first opening 24. An "E-shaped" member 84 of the core 80 may be inserted into the openings with a central portion 81 of the core 80 extending through the first opening 24 and a pair of side members 83 of the core 80 extending through the side openings 29. Although not visible in FIG. 1, a second member of the core, such as an "I-shaped" member 82 of the core 80 may be positioned on the reverse side of the PCB 20. Clips 27 extending up through the side openings 29 secure the two members of the core 80 together and positively retain the core 80 to the PCB 20. Optionally, an adhesive material may be applied between contacting surfaces of the "E-shaped" and "I-shaped" members to secure the core members together.

Figure 5:
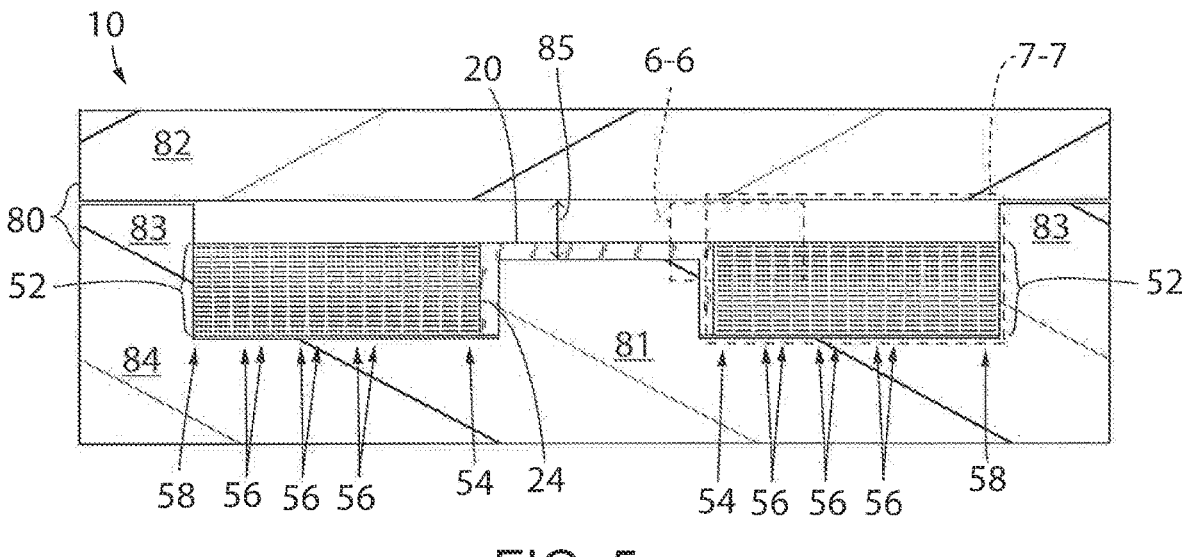
FIG. 5 is a partial sectional view of one embodiment of a magnetic component integrated into a PCB illustrating a core material and a baseline layout of traces on each layer of a PCB enclosed within the core material.

With reference also to FIG. 5, an exemplary sectional view of such an E-I core configuration is illustrated. The E-shaped member 84 is illustrated on the lower surface and the I-shaped member 82 is illustrated on the upper surface. It is understood that terms such as upper and lower, left and right, front and back, and the like are intended to be relational with respect to a figure and are not intended to be limiting. The illustrated magnetic component 10 may be rotated around a vertical axis, horizontal axis, or about any other axis of rotation for installation within a power converter and the associated components will similarly be rotated. It is further contemplated that various other configurations of the core 80 may be utilized without deviating from the scope of the invention. For example, other shapes including, but not limited to, U-shaped members, C-shaped members, R-shaped members, T-shaped members, D-shaped members, F-shaped members, and the like may be utilized according to the application requirements. Suitable openings may be cut through the PCB 20 and a suitable arrangement of traces on each layer 30 of the PCB 20 may be implemented to complement the corresponding members of the core 80. For ease of illustration and discussion herein, the E-I configuration of the core 80 will be discussed.

Figure 3:
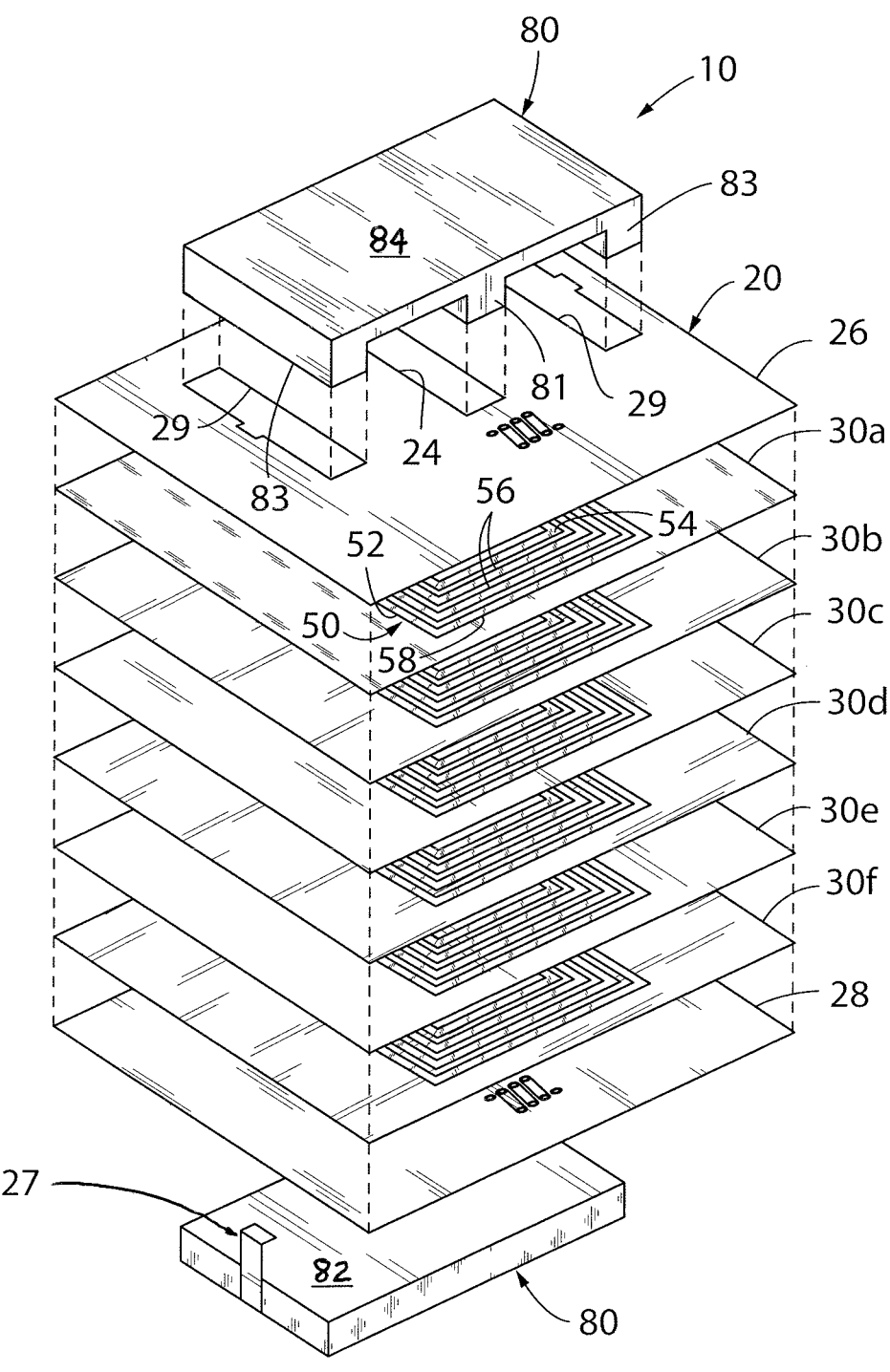
FIG. 3 is an exploded view of a magnetic component integrated into a PCB according to another embodiment of the invention.
Figure 4:
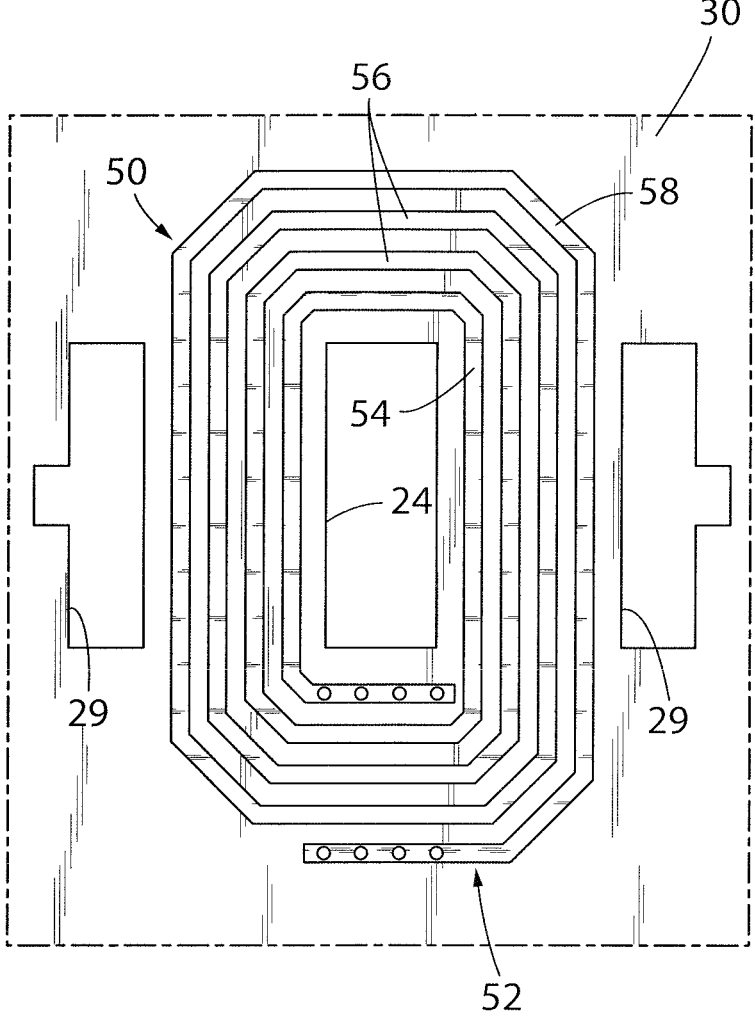
FIG. 4 is a top plan view of one layer of the PCB of FIG. 3.

With reference also to FIGS. 3 and 4, the circuit traces 52 are distributed on the PCB 20 such that they loop around the opening 24. Multiple loops may be formed on each layer 30 of the PCB 20 where an inner trace 54 is closest to the opening 24 and outer trace 58 is furthest from the opening 24. Various numbers of intermediate traces 56 may be defined between the inner trace 54 and the outer trace 58. Vias extending between layers of the PCB 20 may join coils on different layers to form a single coil spanning multiple layers 30. The embodiment illustrated in FIGS. 3 and 4 includes 4 loops on a layer for ease of illustration. It is contemplated that various other numbers of loops may be utilized according to the application requirements. Similarly, the illustrated embodiment includes eight layers on the PCB. A top layer 26 and a bottom layer 28 each include solder pads to which wires or other electrical conductors may be connected. Six intermediate layers 30a-30f are illustrated between the top and bottom layers, where each of the intermediate layers 30a-30f includes four loops. It is contemplated that the PCB 20 may include various other numbers of layers 30 according to the length of the traces and number of loops desired. In one embodiment of the invention, the PCB 20 may include 20 layers. The number, length, and cross-section of the traces defining loops on a layer 30 and further the number of layers 30 on which loops are present define an inductance for the magnetic component. The layout and selection of the number of loops and number of layers, therefore, are selected according to the filtering requirements of the application in which the magnetic component is integrated.

Turning next to FIG. 5, a baseline arrangement of a magnetic component 10 includes a core having an E-I configuration. The sectional view is taken at a point through the core 80. The E-shaped member 84 is illustrated on the bottom with a circuit board 20 positioned on top of the E-shaped member 84. The central portion 81 of the core extends upward through the center opening 24 in the PCB 20 and each side member 83 extends upward through a side opening 29 in the PCB 20. For ease of illustration, however, the PCB 20 is only shown within the core between the two side members 83. The I-shaped member 82 spans across the two side members 83 and an air gap 85 exists between the end of the central portion 81 of the core 80 and the surface of the I-shaped member 82. The sectional view of the PCB 20 is shown as a solid block without illustrating individual layers 30 of the PCB 20 for ease of illustration. The sectional view of each trace 52 is shown, where it is understood that each trace 52 in a row is on the same layer 30 of the PCB 20. The baseline arrangement includes traces 52 of uniform width arranged in uniform rows and columns. Segments of the magnetic component 10 from FIG. 5 are illustrated in more detail in FIGS. 6 and 7 along with a graphical representation of flux linkages that, at least in part, induce eddy currents and generate losses within the traces 52 of the magnetic component.

Figure 6:
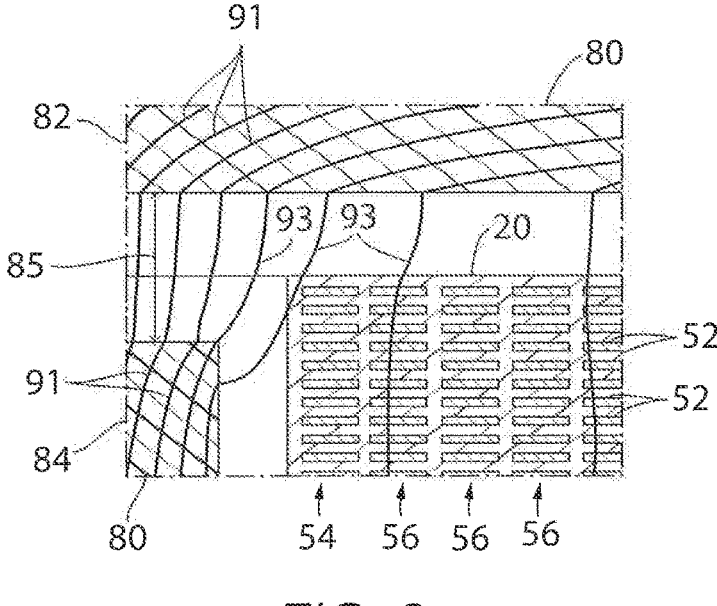
FIG. 6 is a partial sectional view of the magnetic component of FIG. 5 taken at 6-6 illustrating air-gap fringing flux.

Turning first to FIG. 6, flux lines 91 are shown extending through the core 80. The air gap 85 is designed to create a region of high magnetic reluctance through which the flux 91 is forced to traverse. Air has a relatively low magnetic permeability compared to the magnetic core material. Because of the high magnetic reluctance at the air gap 85 region, a portion of the flux 93 fringes outward from the air gap 85. If the air gap 85 existed only directly between two core materials (e.g., a gap in a bar), the air gap fringe flux 93 would be generally arc-shaped as it exited the core 80 on one side of the air gap 85 and entered the core 80 on the other side of the air gap 85. However, because the I-shaped member 82 extends laterally beyond the air gap 85 a portion of the fringing flux 93 extends outward from the end of the central portion of the E-shaped member 84 and reenters the I-shaped member 82 laterally beyond the periphery of the central portion 81 of the E-shaped member, passing through the PCB 20. Conductive members, such as traces 52, located within the path of the air gap fringing flux 93 have eddy currents induced within the traces 52 as a result of the flux passing through the traces. The eddy currents, in turn, cause localized heating in those traces within the path of the air gap fringing flux 93.

Figure 7:
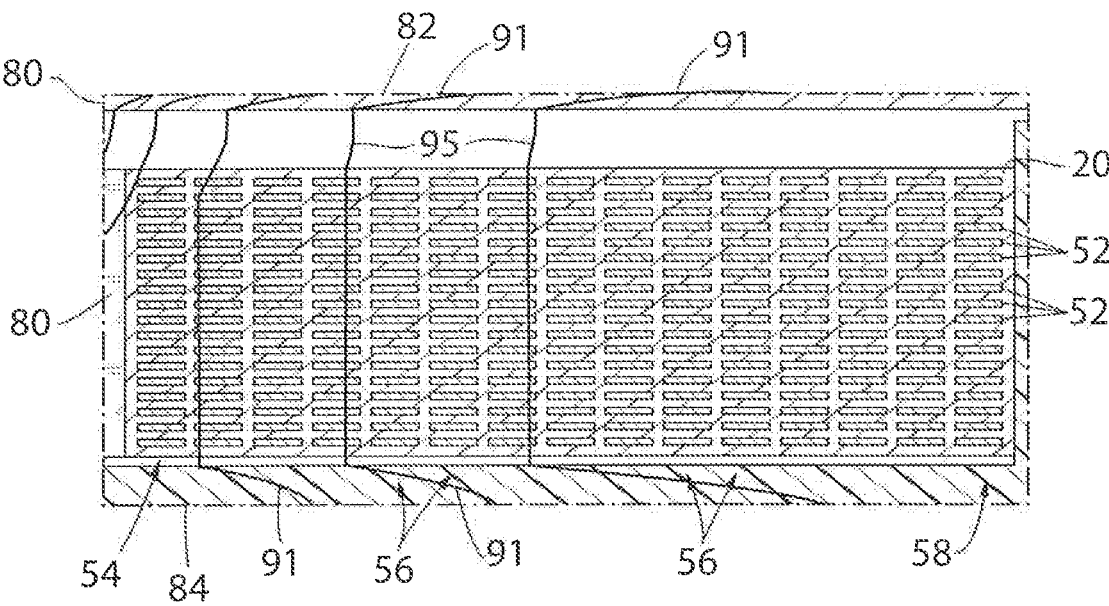
FIG. 7 is a partial sectional view of the magnetic component of FIG. 5 taken at 7-7 illustrating slot window leakage flux.

Turning then to FIG. 7, magnetic flux lines 91 are again shown extending through the core 80. In addition, leakage flux lines 95 are shown illustrating slot window leakage fluxes passing through a portion of the traces 52 on the PCB 20. As shown, the slot window leakage fluxes are small or non-existent toward the outer edge of the core 80. Moving from right-to-left in FIG. 7, the number of turns of the coil increases closer to the air gap 85 in the core 80, thereby increasing the magnetomotive force (MMF) present in the magnetic circuit. The increasing MMF, in turn, causes a portion of the flux in the magnetic circuit to travel between the I-shaped member 82 and the E-shaped member 84 at a location other than the air gap. These flux lines 95 are referred to as slot window leakage fluxes and increase in density as the MMF increases closer to the air gap in the core 80. The slot window leakage fluxes 95 induce eddy currents within the traces 52 present along the path of the flux lines 95 causing localized heating in those traces.

Figure 8:
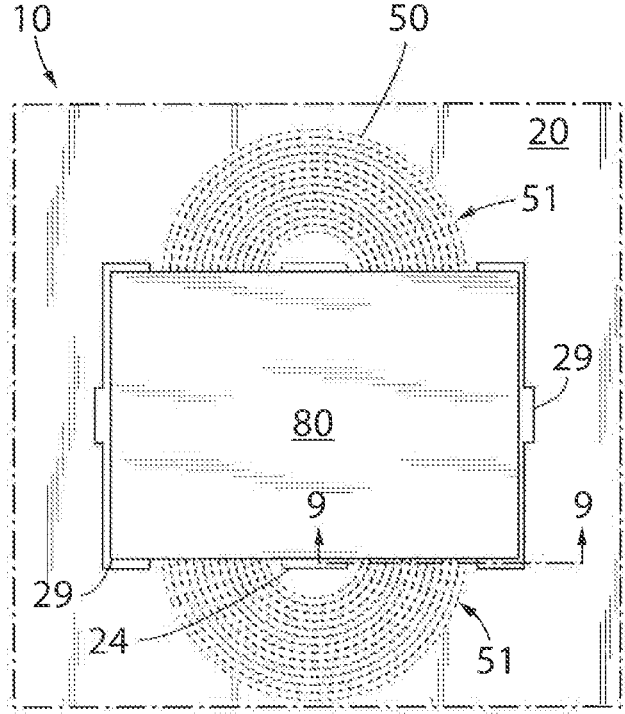
FIG. 8 is a top plan view of the magnetic component of FIG. 5.
Figure 9:
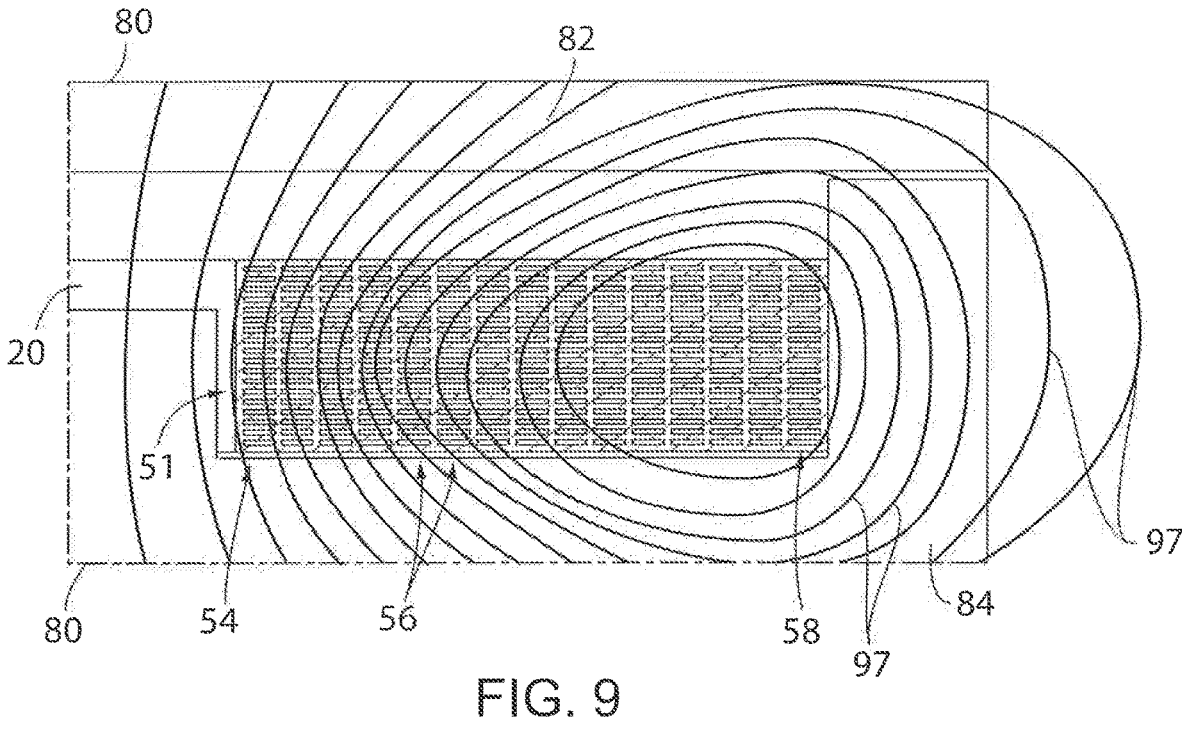
FIG. 9 is a partial sectional view of the magnetic component of FIG. 8 taken at 9-9.

With reference next to FIGS. 8 and 9, still another source of eddy currents in the magnetic component 10 is illustrated. FIG. 9 is a sectional view of the magnetic component 10 looking through the PCB 20 at a point where the coil 50 is outside of the core 80. The upper and lower portions of the coil 50 are also referred to as end turns 51, where each end turn 51 joins the portions of the coil under the core 80 on either side of the central opening 24. When the coil 50 is not located under the core 80, the magnetic flux produced from currents flowing through the traces 52 result in end-turn leakage flux 97. Without the presence of the core 80, the magnetic flux exits the PCB 20 travels through air and returns to the PCB 20. Similar flux paths are established in the absence of a core material 80, also referred to as an air-core magnetic component. The density of the end-turn leakage flux 97 is greater along the inner periphery of the coil 50 as the MMF is similarly greater along the inner periphery of the coil 50 and decreases toward the outer periphery of the coil 50. The end-turn leakage fluxes 97 induce eddy currents within the traces 52 present along the path of the flux lines 97 causing localized heating in those traces.

As discussed above, magnetic flux that is established outside of the core material 80 and that passes through traces 52 creates eddy currents within those traces 52 present along the path of the flux lines 97. The eddy currents result in power losses and localized heating within the magnetic component 10. Various embodiments of the present invention utilize one or more techniques to reduce the interaction between the leakage fluxes and the traces 52 on the PCB 20.

Figure 10:
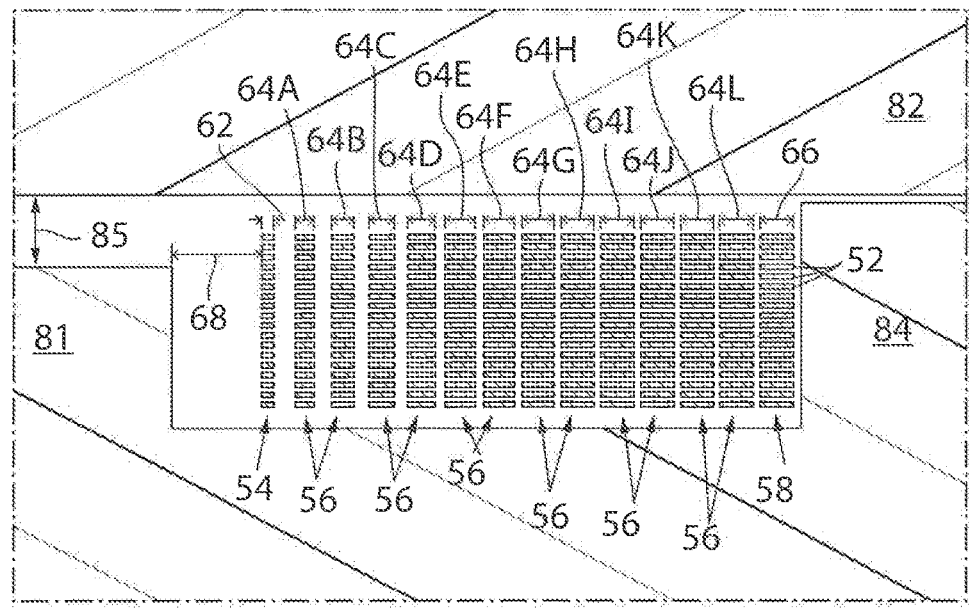
FIG. 10 is a partial sectional view of a magnetic component according to one embodiment of the invention illustrating a trace configuration in which the widths of the traces are varied.

Turning next to FIG. 10, a first embodiment of the magnetic component 10 varies the width of traces 52 in the PCB 20. For ease of illustration, the PCB 20 is not shown. FIG. 10 includes only sectional views of the E-shaped member 84 and I-shaped member 82 of the core 80 as well as sectional views of traces 52 on the PCB 20. However, traces 52 illustrated in the same row in FIG. 10 are on a single layer of the PCB 20. The inner trace 54 on each layer has a first width 62. According to the illustrated embodiment, the first width 62 is the same for the inner trace 54 on each layer. Each intermediate trace 56 has a second width 64. As shown in FIG. 10, the coil includes twelve columns of intermediate traces 56. Each column is defined by its own width 64A-64L. As illustrated, the intermediate widths 64A-

64L of the traces 52 in each column is the same for each layer of the PCB 20. The outer trace 58 on each layer has a third width 66. According to one embodiment of the invention, the width of the traces 52 are continuously varying between the inner trace 54 and the outer trace 58 such that each width (62, 64A-64L, 66) is different. Optionally, a portion of the widths may vary. According to the illustrated embodiment, the first width 62 of the inner trace 54 is less than the first intermediate width 64A of the intermediate trace 56 adjacent to the inner trace 54. The width of the intermediate traces 56 varies between the first intermediate trace and the sixth intermediate trace. Thus, the intermediate widths 64A-64F incrementally increase for each intermediate trace 56 located further from the inner trace 54. Between the sixth intermediate trace and the outer trace 58, the remaining widths (64F-64L, 66) of the traces are the same. As previously discussed, the fringing flux 93 and the slot window leakage flux 95 both increase in concentration closer to air gap and, therefore, also closer to the inner trace 54 of the coil. The interaction of these fluxes with the traces 52 on the PCB 20 result in eddy currents being induced in the traces. The proposed embodiment of FIG. 10 reduces the sectional area of traces 52 present in the region proximate the air gap 85 and, therefore, reduces the magnitude of the resultant eddy currents induced in the traces 52. Reducing the magnitude of the eddy currents induced in the traces 52 along the inner loops of the coil reduces the localized heating in the PCB and increases the efficiency of the magnetic component 10. As another aspect of the invention, the inner trace 54 may be spaced apart from the central portion 81 of the E-shaped member 84 by an inner spacing 68 to eliminate any traces 52 from the region of the magnetic component 10 in which the greatest concentration of leakage fluxes is present.

Figure 11:
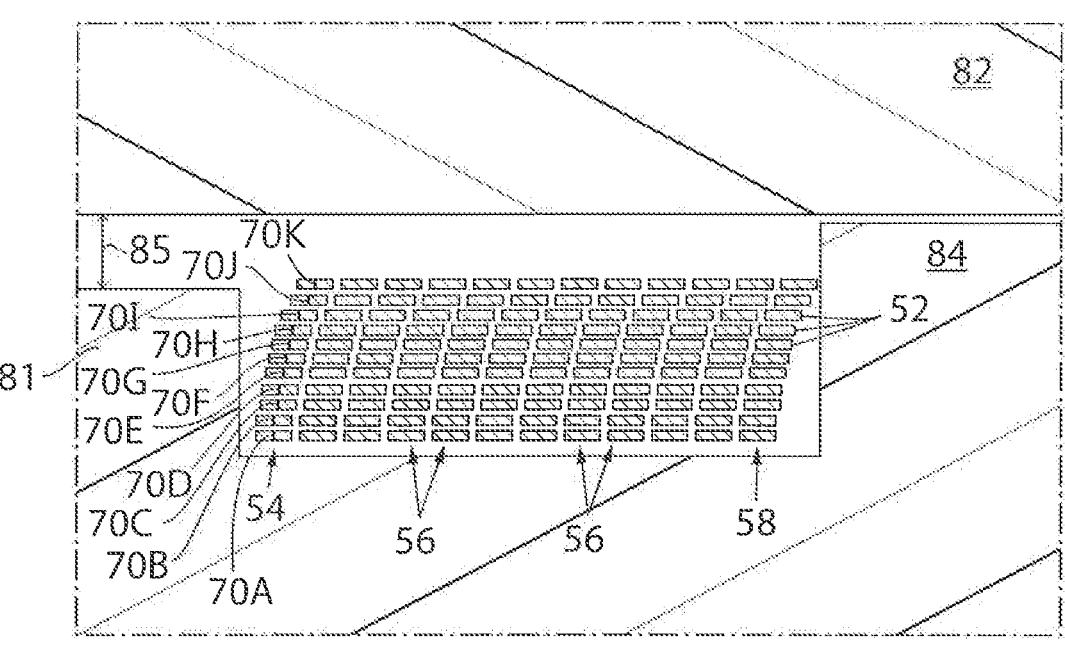
FIG. 11 is a partial sectional view of a magnetic component according to one embodiment of the invention illustrating a trace configuration in which the positions of the traces are varied.

With reference next to FIG. 11, a second embodiment of the magnetic component 10 varies the position of traces 52 in the PCB 20. Once again, for ease of illustration, the PCB 20 is not shown. FIG. 11 includes only sectional views of the E-shaped member 84 and I-shaped member 82 of the core 80 as well as sectional views of traces 52 on the PCB 20. However, traces 52 illustrated in the same row in FIG. 11 are on a single layer of the PCB 20. Each of the traces 52 has a uniform width and an axis 70 defined extending vertically through a midpoint of the trace 52. The traces 52 on the lowest layer have a first axis 70A, and the traces 52 on each subsequent layer extending upward through the PCB have a corresponding axis (70B-70K) defined. The axes are illustrated only in the column of inner traces 54, however, it is understood that each column of traces has a unique set of axes. The second axis 70B, defined in the trace 52 immediately above the trace having the first axis 70A, is offset from the first axis 70A in a direction further away from the central portion 81 of the E-shaped member 84. The third axis 70C, defined in the trace 52 immediately above the trace having the second axis 70B, is again offset from the second axis 70B an additional distance away from the central portion 81 of the E-shaped member 84. As may be seen in FIG. 11, each subsequent trace 52 transitioning from the lowest layer to the highest layer is offset from the trace in the adjacent layer such that the inner trace 54 on the highest layer is spaced the furthest distance from the central portion 81 of the E-shaped member 84 compared to each of the other inner traces 54. With reference again to FIG. 6, the arrangement of traces 52 shown in FIG. 11 shifts the traces nearest the air gap 85 away from the air gap, thereby reducing the amount of fringing flux 93 interacting with the traces 52 and reducing the magnitude of the resultant eddy currents induced in the traces 52. Reducing the magnitude of the eddy currents induced in the traces 52 reduces the localized heating in the PCB and increases the efficiency of the magnetic component 10.

Figure 12:
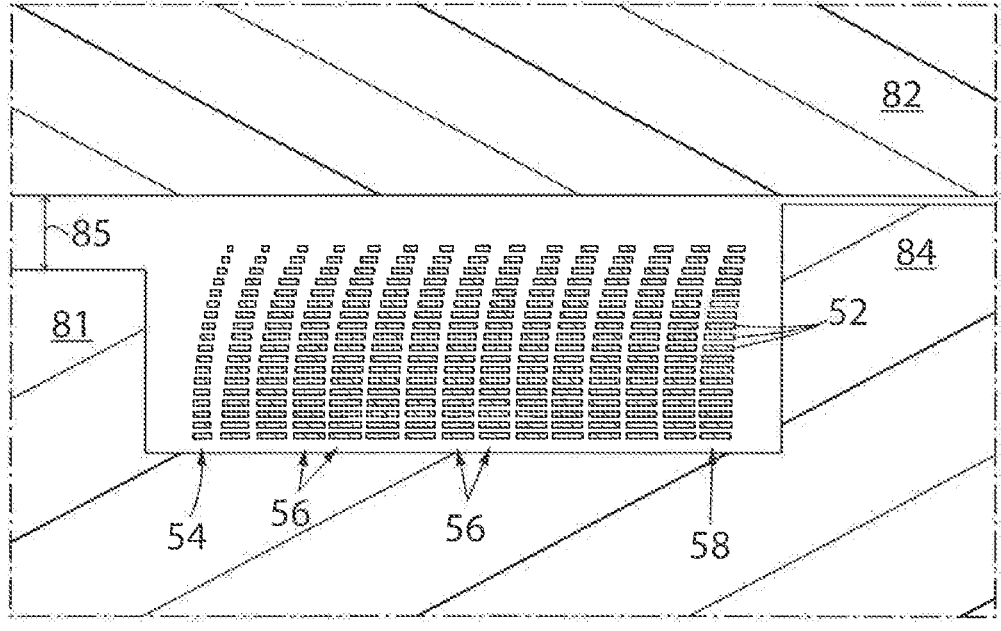
FIG. 12 is a partial sectional view of a magnetic component according to one embodiment of the invention illustrating a trace configuration in which both the widths and the positions of the traces are varied.

Turning then to FIG. 12, a third embodiment of the magnetic component 10 varies both the width and the position of traces 52 in the PCB 20. Once again, for ease of illustration, the PCB 20 is not shown. FIG. 12 includes only sectional views of the E-shaped member 84 and I-shaped member 82 of the core 80 as well as sectional views of traces 52 on the PCB 20. However, traces 52 illustrated in the same row in FIG. 12 are on a single layer of the PCB 20. Each column of traces 52 includes a gradual offset of the axes between traces 52 in adjacent layers such that the trace 52 in the upper most layer of each column is offset away from the central portion 81 of the E-shaped member 84 further than the trace 52 in the lowest layer of the respective column in a manner similar to that discussed above with respect to FIG. 11. Additionally, the widths of the traces 52 are varied to reduce the cross-sectional area of traces present near the air gap 85. The widths of traces 52 in a column nearest the central portion 81 of the E-shaped member 84' are narrowest with incremental increases in the width of traces in adjacent columns moving away from the central portion 81 of the E-shaped member 84. In addition, the widths of traces 52 are further varied within individual columns. A trace 52 at the lowest layer has a width greater than the trace 52 at the next layer of the PCB 20 above the lowest trace. As traces 52 are laid out in each layer 30, the trace 52 on a layer adjacent to and immediately above another layer has a width that is less than the trace 52 on the layer below. As a result, the width of the traces 52 become incrementally narrower in sequence moving from the lowest layer to the uppermost layer. The combination of varying the width and the position of the traces 52 reduces the cross-sectional area of traces 52 in regions of higher fringing and leakage fluxes 93, 95 thereby reducing the localized heating in the PCB resulting from eddy currents induced in traces in those regions and increasing the efficiency of the magnetic component 10.

Figure 13:
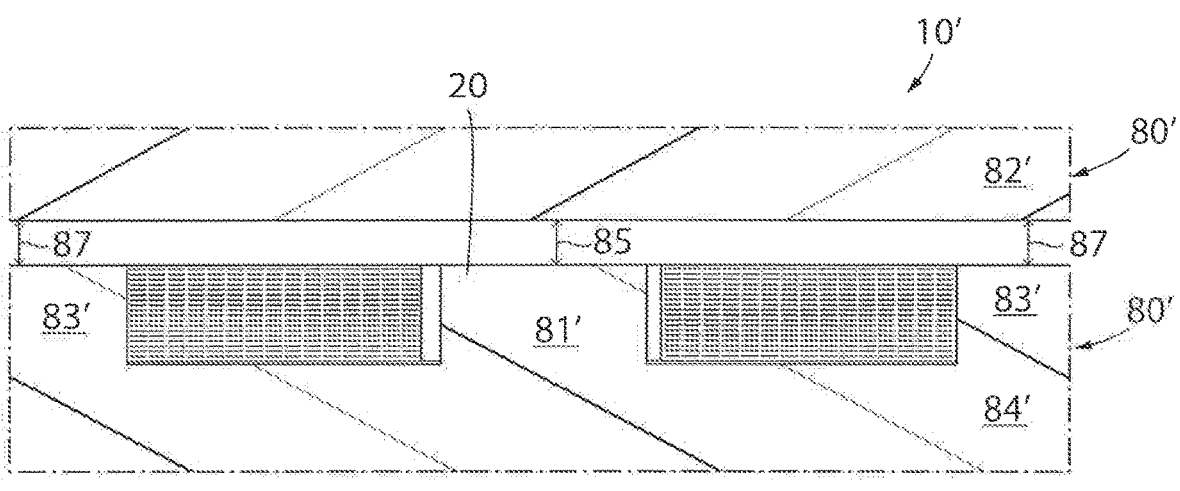
FIG. 13 a partial sectional view of another embodiment of a magnetic component integrated into a PCB illustrating a core material with a distributed air gap and a baseline layout of traces on each layer of a PCB enclosed within the core material.

The various embodiments of the invention have thus far been discussed with respect to a single air gap 85 located in the center of the core 80. It is further contemplated that the invention may be incorporated into a core 80' with a distributed air gap as shown in FIG. 13. The distributed air gap includes a first air gap 85 between the central portion 81' of the E-shaped member 84' and the I-shaped member 82' and side air gaps 87 that are located between the side members 83' of the E-shaped member 84' and the I-shaped member 82'. With an air gap 85, 87 located on either side of the coil, the fringing flux 93 and leakage flux 95 effects previously discussed with respect to FIGS. 6 and 7 occur on either side of the coil. Consequently, it would be desirable to vary the position and/or width of the traces 52 on either side of the coil.

Figure 14:
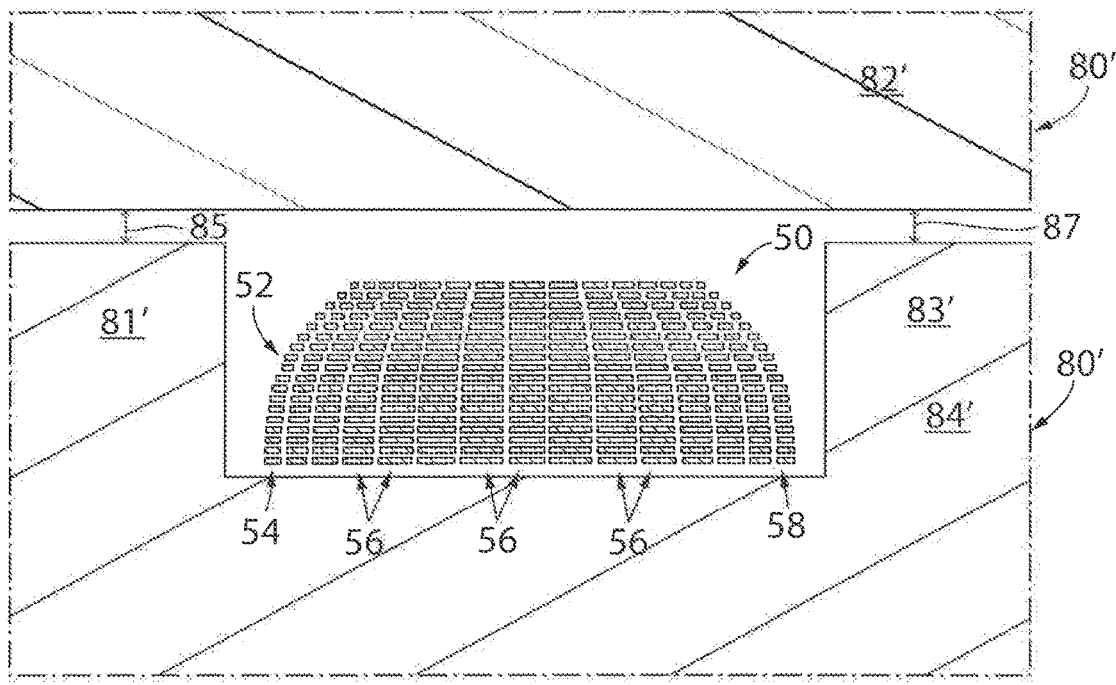
FIG. 14 is a partial sectional view of a magnetic component incorporated into the core material with the distributed air gap shown in FIG. 13 illustrating a trace configuration in which both the widths and the positions of the traces are varied.

Turning next to FIG. 14, an exemplary embodiment of the magnetic component 10 varies both the width and the position of the traces 52 on both sides of the coil in the PCB 20. In accordance with prior illustrations, FIG. 14 includes only sectional views of the E-shaped member 84' and I-shaped member 82' of the core 80' with a distributed air gap as well as sectional views of traces 52 on the PCB 20. However, traces 52 illustrated in the same row in FIG. 14 are on a single layer of the PCB 20. Each column of traces 52 includes a gradual offset of the axes between traces 52 in adjacent layers such that the trace 52 in the upper most layer of each column is offset toward the center of the coil 50 further than the trace 52 in the lowest layer of the respective column in a manner similar to that discussed above with respect to FIG. 11. However, in addition to offsetting the columns away from the central portion 81' of the E-shaped member 84' the columns closer to the outer periphery of the coil 50 are offset from the side members 83' of the E-shaped member 84' toward the center of the coil. Additionally, the widths of traces 52 are varied to reduce the cross-sectional area of traces present near either air gap 85, 87. The widths of traces 52 in a column nearest the central portion 81' or the side member 83' of the E-shaped member 84' are narrowest with incremental increases in the width of traces in adjacent columns moving toward the center of the coil 50. In addition, the widths of traces 52 are further varied within individual columns. A trace 52 at the lowest layer has a width greater than the trace 52 at the next layer of the PCB 20 above the lowest trace. As traces 52 are laid out in each layer 30, the trace 52 on a layer adjacent to and immediately above another layer has a width that is less than the trace 52 on the layer below. As a result, the width of the traces 52 become incrementally narrower in sequence moving from the lowest layer to the uppermost layer. The combination of varying the width and the position of the traces 52 reduces the cross-sectional area of traces 52 in regions of higher fringing and leakage fluxes 93, 95 thereby reducing the localized heating resulting from eddy currents induced in traces in those regions and increasing the efficiency of the magnetic component 10.

Figure 15:
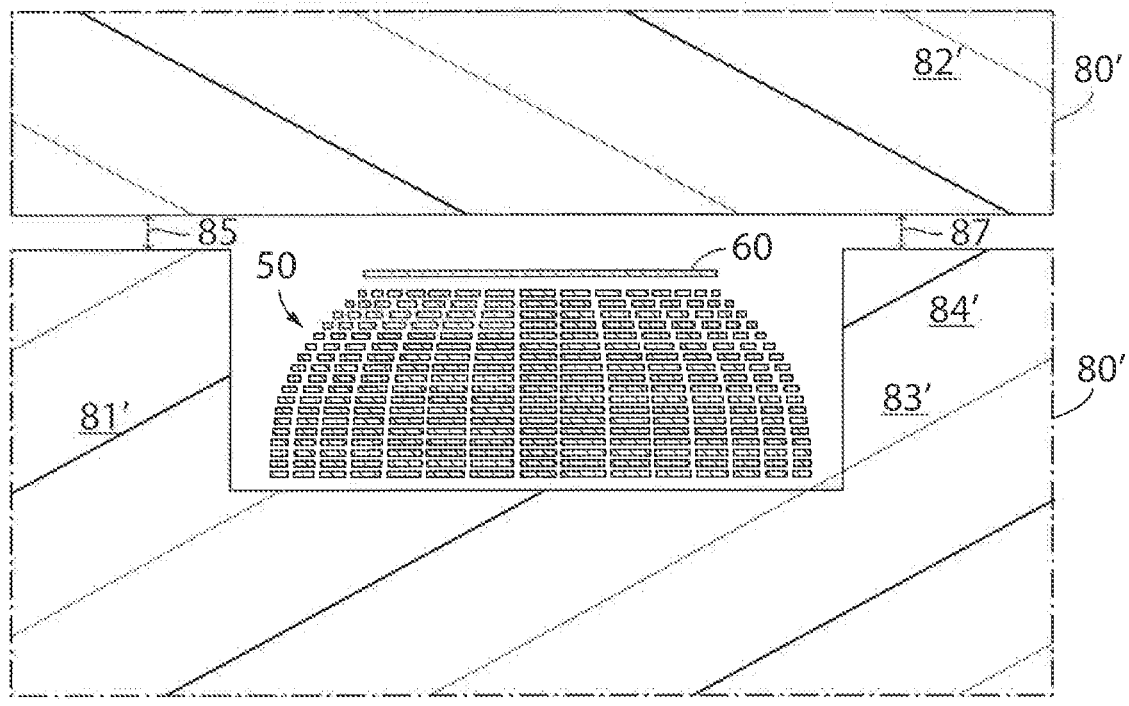
FIG. 15 is a partial sectional view of a magnetic component incorporated into the core material with the distributed air gap shown in FIG. 13 illustrating a trace configuration in which both the widths and the positions of the traces are varied and in which a floating shield layer is included.

Turning next to FIG. 15, still another embodiment of the invention may include a shield 60 located between the I-shaped member 82' and the rest of the coil 50. One layer of the PCB 20 at or near the top layer, may include a trace defining the shield 60. It is contemplated that the shield may be a planar conductive surface extending over a majority of the layer. Optionally, a trace may be routed in a coil, in a back-and-forth pattern, or any combination thereof to provide a conductive layer overlaying a majority of the coil 50. Unlike the different layers within the coil, which may be joined together by vias to form a single, or multiple, conductive coils, the shield layer 60 is electrically isolated from, or not connected to, the other traces 52 in the coil 50. The fringing flux 93 and the slot window leakage flux 95 enter the shield 60 layer and induce eddy currents in this layer. By causing the leakage fluxes to enter the shield layer 60, the localized heating and undesirable eddy currents are primarily contained within the shield layer 60. Because the shield 60 is located near the upper surface of the PCB 20, removal and management of heat induced within the shield 60 is improved than if the heat is induced in traces 52 more centrally located within the PCB.

The embodiments discussed previously have focused on layout of traces 52 on the PCB 20 in regions covered by the core 80. As discussed above, with respect to FIGS. 8 and 9, end turn regions 51 or coreless PCBs exhibit leakage flux 97 in a somewhat different pattern. Because there is no influence of the core material, the flux 97 established around the coil 50 in open air radiates further and in a more symmetrical pattern around the coil. Because the coil illustrated in FIG. 9 has traces 52 arranged in a generally rectangular shape, having a greater width than height, the end-turn flux 97 resulting from current conducted in the traces is generally radiated around the coil in an oval shape where the oval is more elongated with respect to the width than the height. A greater concentration of flux 97 is present along the inner trace 54 due to an increased MMF as well as the proximity of the other half of the coil positioned on the other side of the opening 24. Nevertheless, the flux 97 generated is generally symmetric about a horizontal axis extending through the middle of the layers on which traces are present. As a result, the traces 52 may be arranged on the PCB 20 to reduce coupling with the end-turn flux 97.

Figure 16:
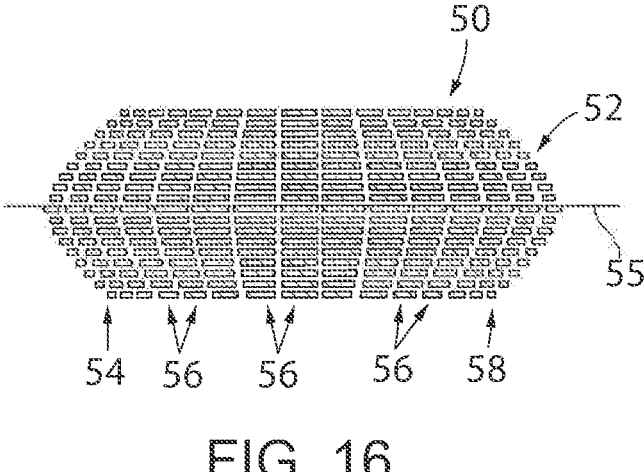
FIG. 16 is a partial sectional view of a magnetic component incorporated into the core material with the distributed air gap shown in FIG. 13 illustrating a trace configuration for end-turns in which both the widths and the positions of the traces are varied.
Figure 17:
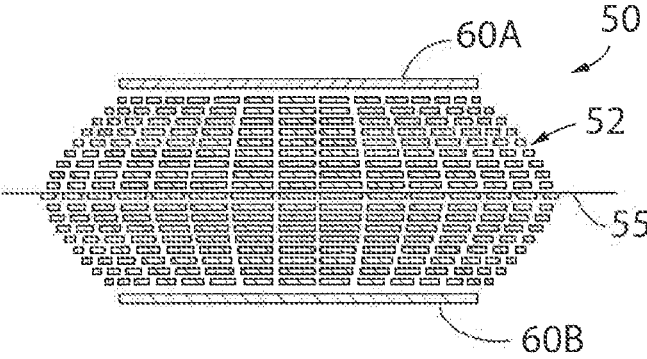
FIG. 17 is a partial sectional view of a magnetic component incorporated into the core material with the distributed air gap shown in FIG. 13 illustrating a trace configuration for end-turns in which both the widths and the positions of the traces are varied and in which floating shield layers are included.

With reference then to FIGS. 16 and 17, two exemplary patterns of traces 52 for the PCB 20 are illustrated. A plane of symmetry 55 extends horizontally through the PCB 20 such that an equal number of layers with traces 52 are included above and below the plane of symmetry 55. The traces 52 on FIGS. 16 and 17 extending upward from the plane of symmetry 55 are configured in a manner similar to that discussed above with respect to FIG. 14 or 15, respectively. Both the width and the position of the traces 52 are varied in both FIGS. 16 and 17 to reduce the presence of traces 52 within regions of higher concentration of end-turn flux 97 and a shield 60A is included in FIG. 17 to absorb the end-turn flux 97 and induce eddy currents within the shield 60*a*. The traces 52 on FIGS. 16 and 17 that extend downward from the plane of symmetry 55 are a mirror image of the traces extending upward. Thus, the traces in both the upper and lower halves of the PCB 20 are arranged to reduce the cross-sectional area of traces 52 in regions of higher end-turn flux 97 and to reduce the localized heating resulting from eddy currents induced in traces in those regions.

According to still another aspect of the invention, it is contemplated that the traces 52 located on the PCB 20 in the end-turns 51, or otherwise in regions not located under or between core material, may have a first sectional profile and the traces 52 located on the PCB 20 in regions located under or between core material may have a second section profile such that the sectional area of the traces 52 in each region are optimized for the different flux distributions experienced in each region. A transitional region located between the two sectional profiles may establish an electrical connection between traces in each region, ensuring a continuous coil 50 is defined on the PCB 20.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A magnetic component, comprising:
a circuit board having at least three consecutive layers and an opening extending through the circuit board; and
a coil defined by a plurality of traces, wherein:
the at least three consecutive layers of the circuit board include a first layer, a second layer, and a third layer,
the plurality of traces includes at least one trace on each of the at least three consecutive layers of the circuit board,
the at least one trace on each layer extends around the opening extending through the circuit board to define a plurality of loops on each layer,
the plurality of loops on each of the at least three consecutive layers define an inner trace proximate the opening through the circuit board, an outer trace distal from the opening through the circuit board, and at least one intermediate trace located between the inner trace and the outer trace,
the inner trace on each layer has a first axis that extends through the inner trace on each of the at least three consecutive layers,
the at least one intermediate trace on each layer has a second axis that extends through the at least one intermediate trace on each of the at least three consecutive layers,
the outer trace on each layer has a third axis that extends through the outer trace on each of the at least three consecutive layers,
at least one of the first axis, the second axis, or the third axis for the inner trace, the at least one intermediate trace, or the outer trace on the second layer is offset from the first axis, the second axis, or the third axis for a corresponding inner trace, a corresponding intermediate trace, or a corresponding outer trace on the first layer,
at least one of the first axis, the second axis, or the third axis for the inner trace, the at least one intermediate trace, or the outer trace on the third layer is offset from the first axis, the second axis, or the third axis for a corresponding inner trace, a corresponding intermediate trace, or a corresponding outer trace on the second layer, wherein the first axis, the second axis, or the third axis offset between the first layer and the second layer is offset in a common direction as the first axis, second axis, or third axis is offset between the second layer and the third layer,
the inner trace, the at least one intermediate trace, or the outer trace on the first layer has a first sectional profile,
the inner trace, the at least one intermediate trace, or the outer trace on the second layer has a second sectional profile, different than the first sectional profile, and
the inner trace, the at least one intermediate trace, or the outer trace on the third layer has a third sectional profile, different than the first sectional profile and the second section profile.

2. The magnetic component of claim 1, wherein:
the circuit board includes a top layer and a bottom layer,
the top layer is closest to a first surface of the circuit board,
the bottom layer is closest to a second surface of the circuit board, and
the second surface of the circuit board is opposite the first surface of the circuit board.

3. The magnetic component of claim 1, wherein:
the first axis of the inner trace on the first layer is at a first position,
the second axis of the at least one intermediate trace on the first layer is at a second position,
the third axis of the outer trace on the first layer is at a third position,
the first axis of the inner trace on the second and third layers are offset from the first position away from the opening extending through the circuit board,
the second axis of the at least one intermediate trace on the second and third layers are offset from the second position away from the opening extending through the circuit board, and
the third axis of the outer trace on the second and third layers are offset from the third position away from the opening extending through the circuit board.

4. The magnetic component of claim 1 wherein:

a first width of the inner trace is less than a second width of the at least one intermediate trace, and a second width of the at least one intermediate trace is less than a third width of the outer trace.

5. The magnetic component of claim 1, wherein each trace on one layer of the circuit board has a different sectional profile in a first portion of the coil than in a second portion of the coil.

6. The magnetic component of claim 1, wherein:

a plane of symmetry extends through the circuit board parallel with the plurality of layers, the first axis, the second axis, and the third axis on a first side of the plane of symmetry are offset from a corresponding axis on adjacent layers in a first pattern, and the first axis, the second axis, and the third axis on a second side second side of the plane of symmetry are offset from a corresponding axis on adjacent layers in a second pattern symmetrical to the first pattern.

7. The magnetic component of claim 1, further comprising:

a core material, wherein:

the core material extends over the opening through the circuit board and laterally over at least a portion of the circuit board, a portion of the core material extends through the opening in the circuit board, a first portion of the coil located on the circuit board between the opening and a first side of the circuit board is under the core material, a second portion of the coil located on the circuit board between the opening and a second side of the circuit board is under the core material, a third portion of the coil located on the circuit board proximate a first end of the circuit board defines a first end turn of the coil and is beyond a first end of the core material, and a fourth portion of the coil located on the circuit board proximate a second end of the circuit board defines a second end turn of the coil and is beyond a second end of the core material.

8. The magnetic component of claim 7, wherein each trace on one layer of the circuit board has a different sectional profile in the first portion of the coil than in the second portion of the coil.

9. The magnetic component of claim 2, further comprising a shield located between the top layer and the coil to induce eddy currents in the shield and, thereby, reduce eddy currents induced in the coil.

10. The magnetic component of claim 2, further comprising a shield located between the bottom layer and the coil to induce eddy currents in the shield and, thereby, reduce eddy currents induced in the coil.

11. A method of integrating a magnetic component in a circuit board, the method comprising the steps of:

defining a plurality of traces for a circuit board, the circuit board including at least three consecutive layers and an opening extending therethrough, wherein:

the at least three consecutive layers of the circuit board include a first layer, a second layer, and a third layer, the plurality of traces includes at least one trace on each of the at least three consecutive layers of the circuit board, the at least one trace on each layer extends around the opening through the circuit board to define a plurality of loops on the respective layer, the plurality of loops on each of the at least three consecutive layers define an inner trace proximate the opening through the circuit board, an outer trace distal from the opening extending through the circuit board, and at least one intermediate trace located between the inner trace and the outer trace, the inner trace on each layer has a first axis that extends through the inner trace on each of the at least three consecutive layers, the at least one intermediate trace on each layer has a second axis that extends through the at least one intermediate trace on each of the at least three consecutive layers, the outer trace on each layer has a third axis that extends through the outer trace on each of the at least three consecutive layers, and at least one of the first axis, the second axis, or the third axis for the inner trace, the at least one intermediate trace, or the outer trace on the second layer is offset from the first axis, the second axis, or the third axis for the inner trace, the at least one intermediate trace, or the outer trace on the first layer, at least one of the first axis, the second axis, or the third axis for the inner trace, the at least one intermediate trace, or the outer trace on the third layer is offset from the first axis, the second axis, or the third axis for a corresponding inner trace, a corresponding intermediate trace, or a corresponding outer trace on the second layer, wherein the first axis, the second axis, or the third axis offset between the first layer and the second layer is offset in a common direction as the first axis, second axis, or third axis is offset between the second layer and the third layer, the inner trace, the at least one intermediate trace, or the outer trace on the first layer has a first sectional profile, the inner trace, the at least one intermediate trace, or the outer trace on the second layer has a second sectional profile, different than the first sectional profile, and the inner trace, the at least one intermediate trace, or the outer trace on the third layer has a third sectional profile, different than the first sectional profile and the second section profile; and mounting a core to the circuit board, wherein a portion of the core is inserted through the opening and the core extends laterally over at least a portion of the plurality of traces.

12. The method of claim 11, wherein:

the circuit board includes a top layer and a bottom layer, the top layer is closest to a first surface of the circuit board, the bottom layer is closest to a second surface of the circuit board, and the second surface of the circuit board is opposite the first surface of the circuit board.

13. The method of claim 12, further comprising the steps of:

providing a shield located between the top layer and the plurality of traces;

conducting current in the plurality of traces; and inducing eddy currents in the shield when conducting current in the plurality of traces, thereby, reducing eddy currents induced in the plurality of traces.

14. The method of claim 12, further comprising the steps of:

providing a shield located between the bottom layer and the plurality of traces;

conducting current in the plurality of traces; and

inducing eddy currents in the shield when conducting current in the plurality of traces, thereby, reducing eddy currents induced in the plurality of traces.

15. The method of claim 11, wherein:

the first axis of the inner trace on the first layer is at a first position, the second axis of the at least one intermediate trace on the first layer is at a second position, the third axis of the outer trace on the first layer is at a third position, the first axis of the inner trace on the second and third layers are offset from the first position away from the opening extending through the circuit board, the second axis of the at least one intermediate trace on the second and third layers are offset from the second position away from the opening extending through the circuit board, and the third axis of the outer trace on the second and third layers are offset from the third position away from the opening extending through the circuit board.

16. The method of claim 11, wherein:

a first width of the inner trace is less than a second width of the at least one intermediate trace, and a second width of the at least one intermediate trace is less than a third width of the outer trace.

17. The method of claim 11, wherein each trace on one layer of the circuit board has a different sectional profile in a first portion of the plurality of traces than in a second portion of the plurality of traces.

18

18. The method of claim 11, wherein:

a plane of symmetry extends through the circuit board parallel with the plurality of layers, the first axis, the second axis, and the third axis on a first side of the plane of symmetry are offset from a corresponding axis on adjacent layers in a first pattern, and the first axis, the second axis, and the third axis on a second side second side of the plane of symmetry are offset from a corresponding axis on adjacent layers in a second pattern symmetrical to the first pattern.

19. The method of claim 11, wherein:

a first portion of the plurality of traces located on the circuit board between the opening and a first side of the circuit board is under the core, a second portion of the plurality of traces located on the circuit board between the opening and a second side of the circuit board is under the core, a third portion of the plurality of traces located on the circuit board proximate a first end of the circuit board defines a first end turn of the plurality of traces and is beyond a first end of the core, and a fourth portion of the plurality of traces located on the circuit board proximate a second end of the circuit board defines a second end turn of the plurality of traces and is beyond a second end of the core.

20. The method of claim 19, wherein each trace on one layer of the circuit board has a different sectional profile in the first portion of the plurality of traces than in the second portion of the plurality of traces.

* * * * *